(12) United States Patent
Park

(10) Patent No.: US 9,693,489 B2
(45) Date of Patent: Jun. 27, 2017

(54) COOLING FLOW CHANNEL MODULE FOR POWER CONVERSION DEVICE AND POWER CONVERSION DEVICE INCLUDING THE SAME

(71) Applicant: HYUNDAI MOBIS CO., LTD., Seoul (KR)

(72) Inventor: Young Seop Park, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 14/929,665

(22) Filed: Nov. 2, 2015

(65) Prior Publication Data
US 2016/0128240 A1    May 5, 2016

(30) Foreign Application Priority Data
Nov. 3, 2014 (KR) .......... 10-2014-0151349

(51) Int. Cl.
*H05K 7/20* (2006.01)
*F28D 1/053* (2006.01)
*F28F 1/12* (2006.01)
*F28F 7/02* (2006.01)
*F28D 21/00* (2006.01)

(52) U.S. Cl.
CPC ..... *H05K 7/20927* (2013.01); *F28D 1/05333* (2013.01); *F28D 1/05383* (2013.01); *F28F 1/12* (2013.01); *F28D 2021/0029* (2013.01); *F28F 7/02* (2013.01); *F28F 2275/12* (2013.01)

(58) Field of Classification Search
CPC .. H05K 7/20927; H05K 7/20872; F28D 1/00; F28D 1/0246

USPC ................................ 361/699–723
See application file for complete search history.

(56) References Cited

U.S. PATENT DOCUMENTS

| | | | | |
|---|---|---|---|---|
| 7,353,859 B2* | 4/2008 | Stevanovic | ........... | H01L 23/473 165/170 |
| 2008/0198548 A1* | 8/2008 | Nakamura | ......... | H05K 7/20927 361/689 |
| 2011/0188204 A1* | 8/2011 | Horiuchi | ............... | H01L 23/473 361/702 |
| 2011/0317366 A1* | 12/2011 | Fukutani | ............... | H01L 25/072 361/699 |
| 2012/0250252 A1* | 10/2012 | Iguchi | ................ | H05K 7/20927 361/689 |
| 2014/0043757 A1* | 2/2014 | Bernstein | ................ | H01L 23/38 361/689 |

(Continued)

*Primary Examiner* — Anthony Haughton
*Assistant Examiner* — Yahya Ahmad
(74) *Attorney, Agent, or Firm* — NSIP Law

(57) ABSTRACT

Provided are a cooling flow channel module for a power conversion device, in which a structure of a cooling flow channel for cooling a power conversion device including an inverter or an LDC is simplified to facilitate manufacturing and assembling, and a power conversion device including the same. The cooling flow channel module includes an intake flow channel, a discharge flow channel disposed to be parallel to the intake flow channel, and a cooling pipe configured to connect the intake flow channel and the discharge flow channel and cool the heating element disposed thereabove or therebelow, wherein a plurality of cooling pipes are provided and connect a side portion of the intake flow channel and a side portion of the discharge flow channel disposed to be parallel to each other.

9 Claims, 5 Drawing Sheets

(56) References Cited

U.S. PATENT DOCUMENTS

| | | | |
|---|---|---|---|
| 2014/0198450 A1* | 7/2014 | Baba | H05K 9/0007 |
| | | | 361/689 |
| 2014/0198453 A1* | 7/2014 | Zhang | H01L 23/473 |
| | | | 361/699 |
| 2014/0239486 A1* | 8/2014 | Gohara | H01L 23/3735 |
| | | | 257/714 |
| 2015/0222195 A1* | 8/2015 | Tachibana | H05K 7/1432 |
| | | | 361/699 |
| 2016/0128240 A1* | 5/2016 | Park | H05K 7/20927 |
| | | | 361/699 |
| 2016/0183409 A1* | 6/2016 | Zhou | H05K 7/20281 |
| | | | 361/699 |
| 2016/0219758 A1* | 7/2016 | Kawaguchi | H05K 7/20927 |
| 2016/0322281 A1* | 11/2016 | Shintani | H01L 23/043 |

* cited by examiner

A-A'

COOLING FLOW CHANNEL MODULE FOR POWER CONVERSION DEVICE AND POWER CONVERSION DEVICE INCLUDING THE SAME

CROSS-REFERENCE TO RELATED APPLICATIONS

This application claims priority under 35 U.S.C. §119 to Korean Patent Application No. 10-2014-0151349, filed on Nov. 3, 2014, the disclosure of which is incorporated herein by reference in its entirety.

TECHNICAL FIELD

The present invention relates to a cooling flow channel module for power conversion device and a power conversion device including the same, and more particularly, to a cooling flow channel module for a power conversion device, which includes a cooling flow channel having a simplified structure to facilitate manufacturing and assembling, and a power conversion device including the same.

BACKGROUND

A hybrid vehicle or an electric vehicle includes a driving motor generating power, an inverter supplying power to the driving motor, a low DC/DC converter (LDC), a high voltage battery, and the like.

Here, since a power conversion device includes various heating elements such as switching elements, a transformer, or an insulated gate bipolar mode transistor (IGBT), a cooling device for cooling heat generated according to an operation is required.

Here, the cooling device is classified into a water cooling type cooling device and an air cooling type cooling device. In general, a water cooling type cooling device is applied to an engine room on a front side of a vehicle and an air cooling type cooling device is applied to a trunk room on the rear side of the vehicle.

Meanwhile, the water cooling type cooling device has a structure in which a cooling flow channel is shared by two LDCs and an inverter disposed to be adjacent to each other for the purpose of reducing the size and enhancing cooling efficiency.

That is, an LDC housing and an inverter housing are separately manufactured and subsequently coupled using a sealant or the like.

Cooling flow channels are formed on a lower surface of the LCD housing and an upper surface of the inverter housing, and a flow channel separator is installed therebetween.

In this structure, however, a configuration of the cooling flow channel of the inverter housing is too complicated to manufacture a mold and there is a difficulty in managing the cooling flow channel after being manufactured.

Also, since the inverter housing and the LCD housing are bonded using a sealant, there is a high possibility of generating a defect.

SUMMARY

Accordingly, the present invention provides a cooling flow channel module for a power conversion device, which has a simple structure to facilitate manufacturing and assembling, which is reduced in weight and volume so as to be light in weight, and which simplifies a design of a mold for manufacturing an inverter unit and converter unit (LCD, or the like), and a power conversion device including the same.

In one general aspect, a cooling flow channel module installed in a power conversion device to cool a heating element constituting the power conversion device includes: an intake flow channel; a discharge flow channel disposed to be parallel to the intake flow channel; and a cooling pipe configured to connect the intake flow channel and the discharge flow channel and cool the heating element disposed thereabove or therebelow, wherein a plurality of cooling pipes are provided and connect a side portion of the intake flow channel and a side portion of the discharge flow channel disposed to be parallel to each other.

In another general aspect, a power conversion device includes: an inverter unit configured to include a heating element; a converter unit configured to be disposed above or below the inverter unit and include a heating element; and a cooling flow channel module disposed between the inverter unit and the converter unit, wherein the cooling flow channel module includes: an intake flow channel; a discharge flow channel disposed to be parallel to the intake flow channel; and a cooling pipe configured to connect the intake flow channel and the discharge flow channel and cool the heating element disposed thereabove or therebelow, wherein a plurality of cooling pipes are provided and connect a side portion of the intake flow channel and a side portion of the discharge flow channel disposed to be parallel to each other.

Other features and aspects will be apparent from the following detailed description, the drawings, and the claims.

DETAILED DESCRIPTION OF EMBODIMENTS

Hereinafter, embodiments of the present invention will be described in detail with reference to the accompanying drawings.

Figure 1:
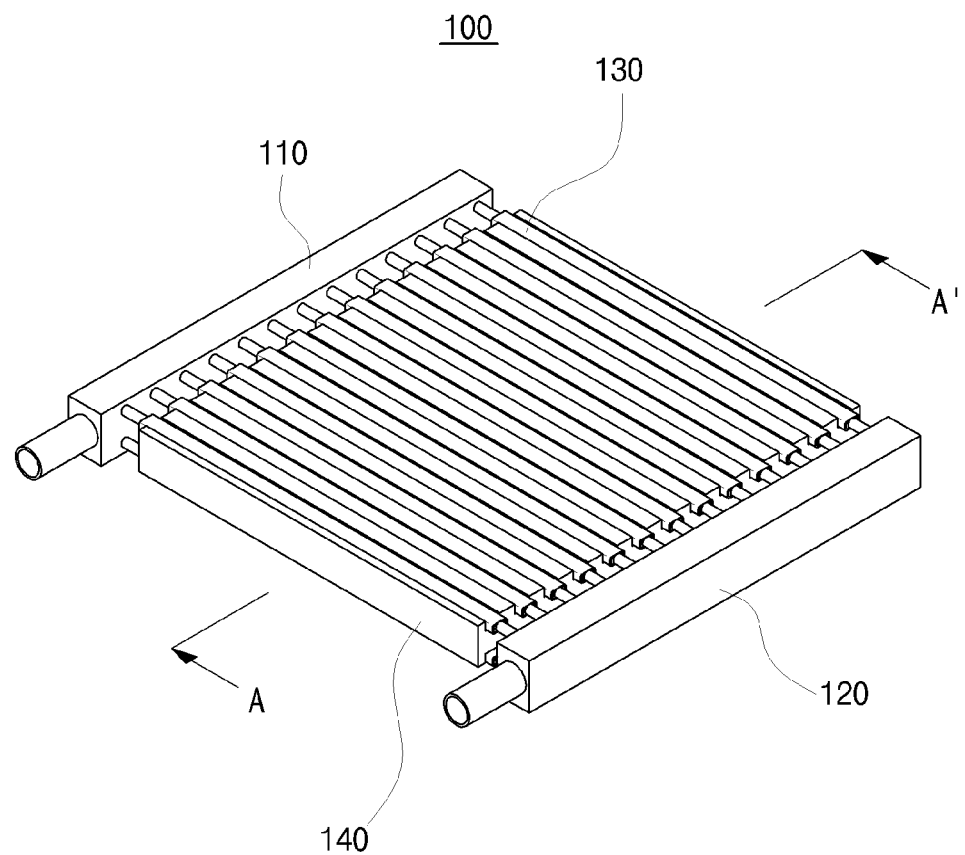
FIG. 1 is a perspective view of a cooling flow channel module for a power conversion device according to an embodiment of the present invention.
Figure 2:
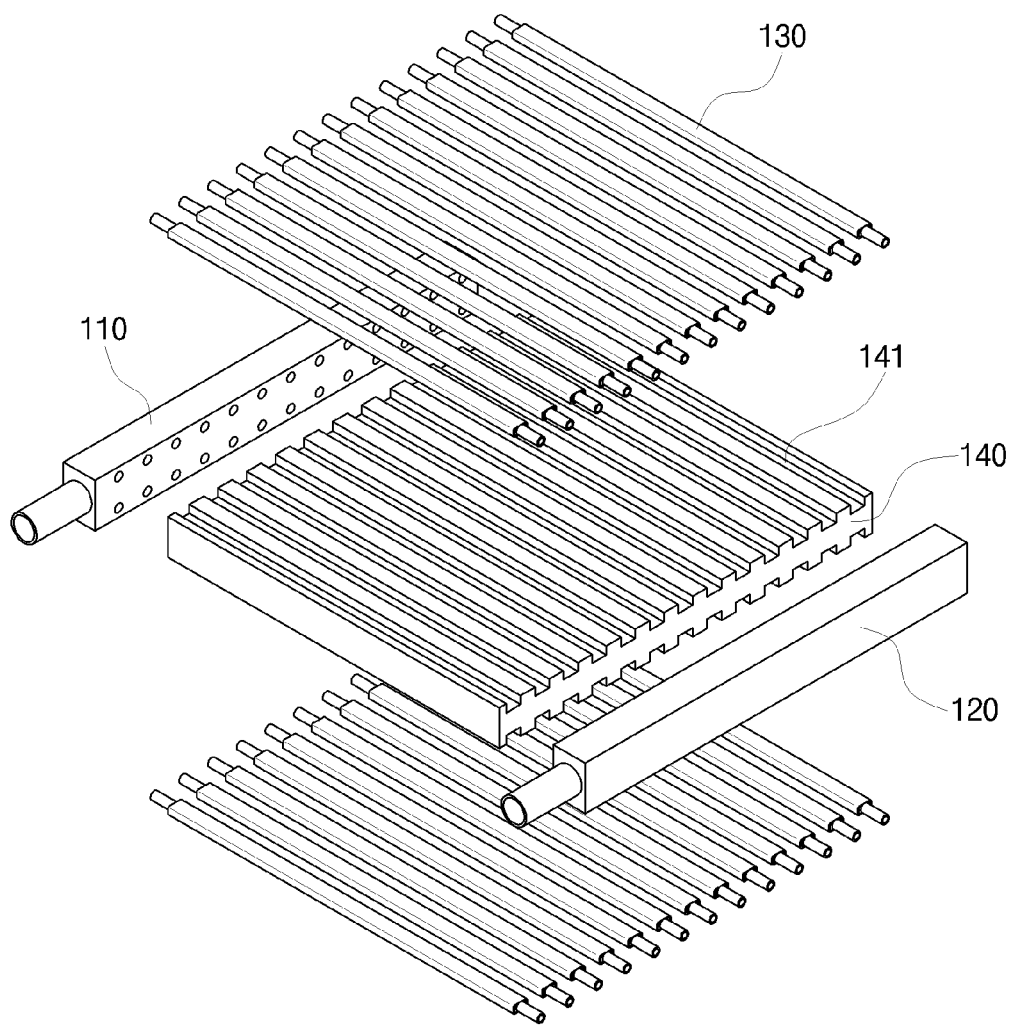
FIG. 2 is an exploded perspective view of the cooling flow channel module for a power conversion device according to an embodiment of the present invention.
Figure 3:
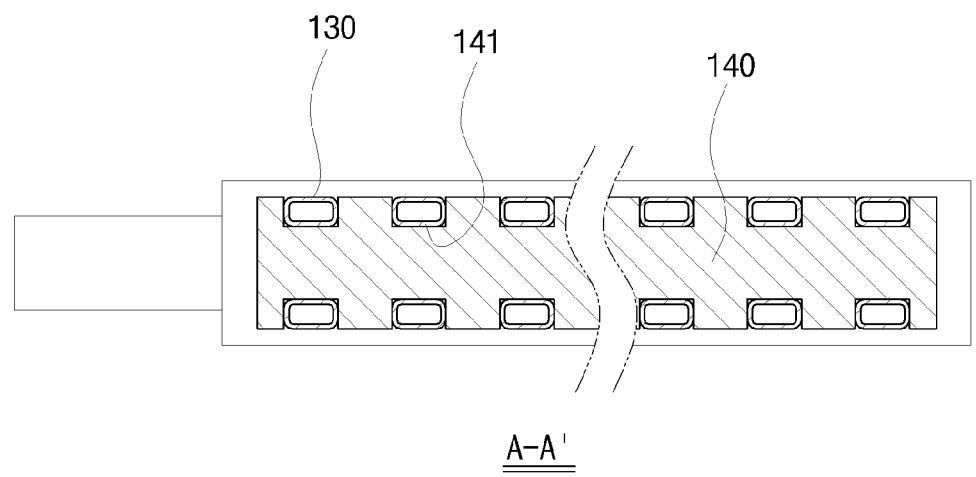
FIG. 3 is a cross-sectional view taken along line A-A' of FIG. 1.
Figure 4A:
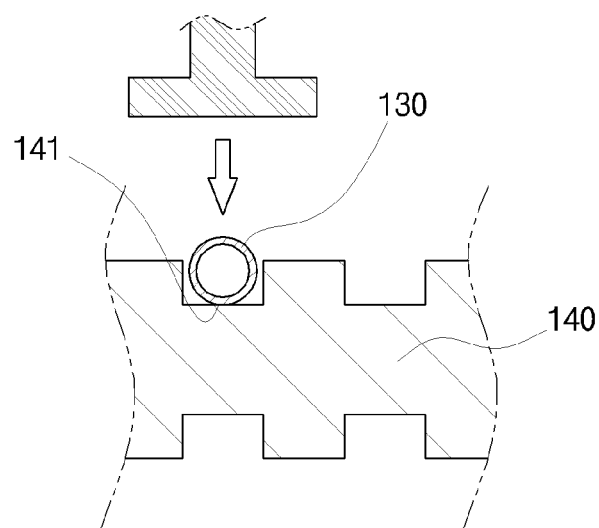
FIG. 4A and FIG. 4B are a view illustrating a process of shaping a cooling pipe in a cooling flow channel module for a power conversion device according to an embodiment of the present invention.
Figure 4B:
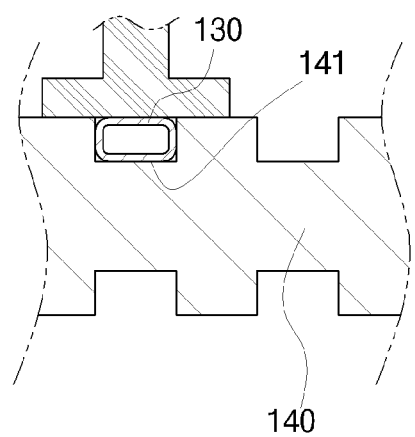
Figure 5:
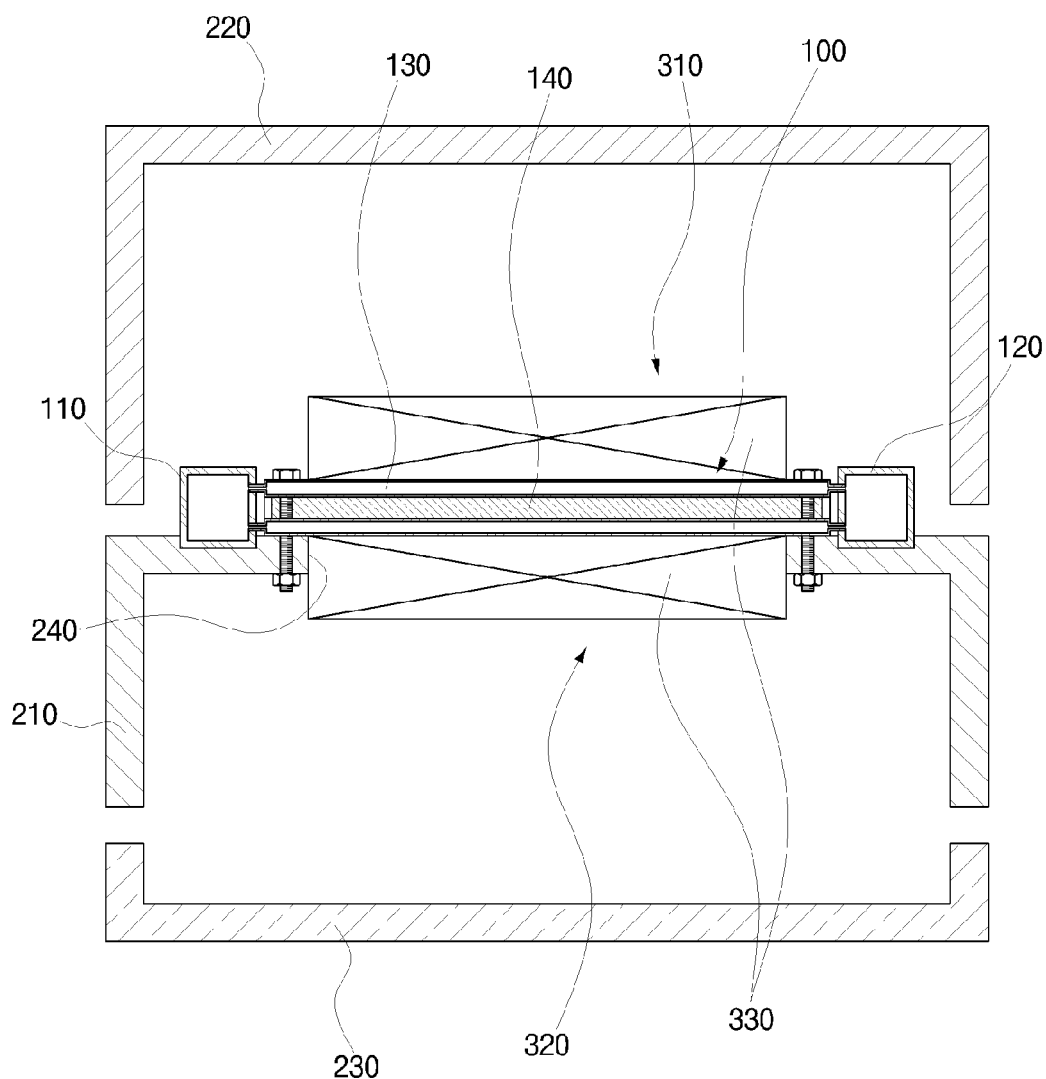
FIG. 5 is a schematic cross-sectional view of a power conversion device including a cooling flow channel module according to an embodiment of the present invention.

FIG. 1 is a perspective view of a cooling flow channel module for a power conversion device according to an embodiment of the present invention, FIG. 2 is an exploded perspective view of the cooling flow channel module for a power conversion device according to an embodiment of the present invention, FIG. 3 is a cross-sectional view taken along line A-A' of FIG. 1, FIG. 4A and FIG. 4B are a view illustrating a process of shaping a cooling pipe in a cooling flow channel module for a power conversion device according to an embodiment of the present invention, and FIG. 5 is a schematic cross-sectional view of a power conversion device including a cooling flow channel module according to an embodiment of the present invention.

A cooling flow channel module for a power conversion device according to an embodiment of the present invention serves to cool a heating element installed in a power conversion device to constitute the power conversion device and more particularly serves to cool a power conversion device such as an inverter or a low DC-DC converter (LDC) installed in a hybrid vehicle or an electric vehicle As illustrated in FIG. 1, a cooling flow channel module 100 for a power conversion device of the present invention includes an intake flow channel 110, a discharge flow channel 120, a cooling pipe 130, and a cooling plate 140.

The intake flow channel 110 and the discharge flow channel 120 have a hollow pipe shape are spaced apart from one another and disposed to be parallel to each other.

A coolant is introduced to the intake flow channel 110, and the coolant introduced through the intake flow channel 110 is discharged through the discharge flow channel 120.

The cooling pipe 130 is disposed between the intake flow channel 110 and the discharge flow channel 120 and allows the intake flow channel 110 and the discharge flow channel 120 to communicate with each other.

In detail, a plurality of cooling pipes 130 are formed and connected to a side portion of the intake flow channel 110 and a side portion of the discharge flow channel 120 disposed to be spaced from one another in parallel, connecting the interior of the intake flow channel 110 and the interior of the discharge flow channel 120.

A heating element 330 installed in the power conversion device is disposed on upper and lower portions of the cooling pipe 130 or on any one of the upper and lower portions of the cooling pipe 130, and the cooling pipe 130 cools the heating element 330.

The cooling pipe 130 is formed of copper to increase cooling efficiency.

The cooling pipe 130 is coupled to the intake flow channel 110 and the discharge flow channel 120 through welding.

Through welding, leakage of a coolant from a connection portion of the cooling pipe 130 may be fundamentally prevented The cooling plate 140 is disposed between the intake flow channel 110 and the discharge flow channel 120.

The plurality of cooling pipes 130 are disposed above and below the cooling plate 140.

The cooling plate 140 includes installation recesses 141 in which the cooling pipes 130 are installed.

The installation recesses 141 are formed on both of the upper and lower surfaces of the cooling plate 140, and the cooling pipes 130 may be easily disposed above and below the cooling plate 140.

Also, after the cooling pipes 130 are installed in the installation recesses 141, the cooling pipes 130 may be stably welded to the intake flow channel 110 and the discharge flow channel 120, and thus, the cooling plate 140 serves as a jig.

As illustrated in FIG. 4A, the cooling pipe 130 is inserted into the installation recess 141 and pressed by a press, or the like, so as to be shaped to have a cross-sectional shape corresponding to the installation recess 141.

As illustrated in FIG. 4B, The installation recess 141 is formed to have a quadrangular recess shape.

Thus, when the cooling pipe 130 having a circular cross-section is inserted into the installation recess 141 having the quadrangular recess shape and pressed by a press, or the like, the cooling pipe 130 is deformed to have a shape corresponding to the installation recess 141, that is, a quadrangular shape.

As for the cooling pipe 130 pressed to have a quadrangular shape, since a surface of the cooling pipe 130, opposing the cooling plate 140 and facing the heating element 330, is shaped to be flat, increasing a contact area with the heating element 130, and thus, cooling effect may increase.

Preferably, the cooling plate 140 allows for smooth heat transmission by the cooling pipes 130 formed of a metal.

As illustrated in FIG. 5, the cooling flow channel module 100 according to an embodiment of the present invention is installed in a power conversion device.

FIG. 5 is a schematic cross-sectional view of a power conversion device including the cooling flow channel module 100 according to an embodiment of the present invention.

The power conversion device of the present invention includes an inverter unit 310, a converter unit 320, and the cooling flow channel module 100.

The inverter unit 310 includes the heating element 330.

The converter unit 320 includes the heating element 330 and is disposed above or below the inverter unit 310.

In this embodiment, the converter unit 320 is disposed above the inverter unit 310.

The converter unit 320 may be a low DC-DC converter (LDC), or the like.

The cooling flow channel module 100 is disposed between the inverter unit 310 and the converter unit 320.

In this embodiment, in order to form the inverter unit 310 and the converter unit 320, the power conversion device includes a main housing 210, a first cover, and a second cover 230.

The first cover 220 covers any one of upper and lower portions of the main housing 210, and the second cover 230 covers the other.

In the drawing, it illustrated that the first cover 220 covers the upper portion of the main housing 210 and the second cover 230 covers the lower portion of the main housing 210.

The main housing 210 and the first cover 220 form the inverter unit 310, and the main housing 210 and the second cover 230 form the converter unit 320.

The cooling flow channel module 100 is assembled to have the structure in advance as described above, and subsequently coupled to the main housing 210 between the first cover 220 and the second cover 230.

In detail, the cooling plate 140 of the cooling flow channel module 100 is coupled to the main housing 210 by a bolt.

The main housing 210 includes a through hole 240, and the cooling flow channel module 100 is coupled to the main housing 210 by a bolt in an upper portion of the through hole 240.

The heating element 330 is disposed in contact with the cooling pipes 130 above and below the cooling pipes 130.

The heating element 330 provided in the inverter unit 310 is in contact with a lower surface of the cooling pipes 130 through the through hole 240, and the heating element 330 provided in the converter unit 320 is in contact with an upper surface of the cooling pipe 130.

Miniaturization and light weight may be achieved by the cooling flow channel module 100 of the present invention described above, and also, when a mold for forming a flow channel of the inverter unit 310 and the converter unit 320 is simplified in design, a time for assembling the inverter unit 310 and the converter unit 320 may be shortened, compared with a case in which a sealant is applied and cured to couple the inverter unit 310 and the converter unit 320.

The cooling flow channel module for a power conversion device and the power conversion device including the same are not limited to the embodiments described above and may be variously modified and implemented within the scope of the present invention.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A cooling apparatus, comprising:
an intake channel;
a discharge channel oriented parallel to the intake channel;
a cooling plate comprising recesses and disposed between the intake channel and the discharge channel;
cooling pipes connecting the intake channel and the discharge channel,
wherein the cooling pipes are disposed inside the recess and are oriented parallel to each other.

2. The cooling apparatus of claim 1, wherein the cooling pipes are disposed above and below the cooling plate.

3. The cooling apparatus of claim 2, wherein the cooling pipes each comprise a cross-sectional shape corresponding to a shape of each of the installation recesses.

4. The cooling apparatus of claim 3, wherein the shape of each of the installation recesses is quadrangular, and surfaces of the cooling pipes opposing the cooling plate and facing the heating element are flat.

5. The cooling apparatus of claim 1, wherein each of the cooling pipes are welded to the intake channel and the discharge channel.

6. A power conversion device, comprising:
an inverter comprising a heating element;
a converter comprising a heating element and disposed above or below the inverter; and
a cooling channel module disposed between the inverter and the converter,
wherein the cooling channel module comprises:
an intake channel;
a discharge channel oriented parallel to the intake channel; and
cooling pipes oriented parallel to each other and connecting the intake channel and the discharge channel.

7. The power conversion device of claim 6, wherein:
the inverter further comprises:
a main housing; and
a first cover covering any one of an upper portion or a lower portion of the main housing,
the converter further comprises a second cover covering the other of the upper portion and the lower portion of the main housing, and
the cooling channel module is coupled to the main housing between the first cover and the second cover.

8. The power conversion device of claim 7, wherein:
the main housing comprises a through hole,
the cooling channel module is coupled to the main housing in an upper portion of the through hole, and
the heating element is in contact with the cooling pipes above and below the cooling pipes.

9. The power conversion device of claim 7, wherein:
the cooling channel module further comprises a cooling plate disposed between the intake channel and the discharge channel,
the cooling pipes are disposed above and below the cooling plate, and
the cooling plate is coupled to the main housing.

* * * * *